US010248159B2

United States Patent
Jin et al.

(10) Patent No.: US 10,248,159 B2
(45) Date of Patent: Apr. 2, 2019

(54) DISPLAY MODULE AND MOBILE TERMINAL

(71) Applicant: Beijing Xiaomi Mobile Software Co., Ltd., Beijing (CN)

(72) Inventors: Hongzhi Jin, Beijing (CN); Zhuxin Li, Beijing (CN); Gaocai Han, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 15/876,934

(22) Filed: Jan. 22, 2018

(65) Prior Publication Data

US 2018/0210490 A1   Jul. 26, 2018

(30) Foreign Application Priority Data

Jan. 22, 2017   (CN) .......................... 2017 1 0053994

(51) Int. Cl.
| G06F 1/16 | (2006.01) |
| G06F 1/18 | (2006.01) |
| H04M 1/02 | (2006.01) |
| H05K 1/18 | (2006.01) |

(52) U.S. Cl.
CPC ........ *G06F 1/1601* (2013.01); *H04M 1/0266* (2013.01); *H04M 1/0277* (2013.01); *H05K 1/189* (2013.01); *G06F 1/183* (2013.01); *G09G 2310/0264* (2013.01); *H01L 2224/48091* (2013.01)

(58) Field of Classification Search
CPC combination set(s) only.
See application file for complete search history.

(56) References Cited

U.S. PATENT DOCUMENTS

| 8,035,789 | B2 * | 10/2011 | Yamada | .............. G02F 1/13452 |
| | | | | 349/110 |
| 9,326,375 | B2 * | 4/2016 | Lee | ......................... H05K 1/028 |
| 9,942,978 | B2 * | 4/2018 | Lee | ......................... H05K 1/028 |
| 2007/0035473 | A1 | 2/2007 | Yamazaki et al. | |
| 2012/0256896 | A1 | 10/2012 | Yamazaki et al. | |
| 2014/0217373 | A1 | 8/2014 | Youn et al. | |

(Continued)

FOREIGN PATENT DOCUMENTS

| CN | 105808027 A | 7/2016 |
| CN | 205722615 U | 11/2016 |

(Continued)

OTHER PUBLICATIONS

Extended European Search Report dated May 3, 2018 in Patent Application No. 18152139.4 citing references AA-AE and AO-AQ therein, 8 pages.

*Primary Examiner* — Lisa Lea-Edmonds
(74) *Attorney, Agent, or Firm* — Oblon, McClelland, Maier & Neustadt, L.L.P.

(57) ABSTRACT

The present disclosure relates to a display module and a mobile terminal. The display module includes a flexible circuit board, a display screen electrically connected to the flexible circuit board, and a drive chip electrically connected to the flexible circuit board and the display screen. The drive chip is located on a first side of the display module that is opposite to a second side of the display module that constitutes a display side of the display screen.

14 Claims, 4 Drawing Sheets

(56) References Cited

U.S. PATENT DOCUMENTS

| | | | |
|---|---|---|---|
| 2014/0307396 A1* | 10/2014 | Lee | H05K 1/028 |
| | | | 361/749 |
| 2015/0228230 A1 | 8/2015 | Yamazaki et al. | |
| 2016/0079336 A1 | 3/2016 | Youn et al. | |
| 2016/0210894 A1* | 7/2016 | Lee | H05K 1/028 |

FOREIGN PATENT DOCUMENTS

| | | |
|---|---|---|
| CN | 106601780 A | 4/2017 |
| CN | 106952941 A | 7/2017 |
| CN | 206422068 U | 8/2017 |
| EM | 1 752 818 A2 | 2/2007 |
| KR | 10-2014-0099164 A | 8/2014 |

* cited by examiner

DISPLAY MODULE AND MOBILE TERMINAL

CROSS-REFERENCE TO RELATED APPLICATION

The present application is based on and claims priority to Chinese Patent Application Serial No. CN 201710053994.7, filed on Jan. 22, 2017, the entire contents of which are incorporated herein by reference.

TECHNICAL FIELD

The present disclosure relates to the field of electronic equipment, and in particular to a display module for an electronic device and a mobile terminal including the display module.

BACKGROUND

One development trend for an electronic device, such as a mobile phone, is to implement a display screen that provides the electronic device with a higher screen-to-body ratio. A driver chip that is provided on a same side of a display module as its display area for driving the display screen may occupy an area on a front side of the display module in such a manner so as to result with a low screen-to-body ratio.

SUMMARY

This Summary is provided to introduce a selection of aspects of the present disclosure in a simplified form that are further described below in the Detailed Description. This Summary is not intended to identify key features or essential features of the claimed subject matter, nor is it intended to be used to limit the scope of the claimed subject matter.

Aspects of the disclosure provide a display module that includes a flexible circuit board, a display screen electrically connected to the flexible circuit board, and a drive chip electrically connected to the flexible circuit board and the display screen. The drive chip is located on a first side of the display module that is opposite to a second side of the display module that constitutes a display side of the display screen.

According to an aspect of the disclosure, the display module also includes an electrical connection portion having a first section electrically and directly connected to the display screen, and a second section electrically connected to the first section via a curved section, wherein the second section is disposed under the first section and is electrically and directly connected to the flexible circuit board.

In an example, the drive chip is electrically and directly connected to the flexible circuit board.

In another example, the flexible circuit board, the display screen, the first section, and the second section are parallel to one another, and wherein the curved section has an arc shape.

According to an aspect of the disclosure, the flexible circuit board has a rectangular shape, and the drive chip has a long strip shape. According to another aspect of the disclosure, a length direction of the flexible circuit board is parallel to a length direction of the drive chip and parallel to a width direction of the display screen.

In an example, the electrical connection portion is integrally formed with the display screen.

In another example, each one of the first section, the curved section, and the second section has a first thickness, and the first thickness is less than a second thickness of the display screen.

According to an aspect of the disclosure, the display screen is an organic light emitting diode (OLED) display screen.

According to another aspect of the disclosure, the electrical connection portion is a flexible conductive film.

In an example, a ratio of a length of the display screen to a length of the first section is in a range from 90 to 115.

According to an aspect of the disclosure, the display module also includes a cover glass affixed to the display screen. According to another aspect of the disclosure, a ratio of a length of the display screen to a length of the cover glass is in a range from 0.8 to 0.98.

Aspects of the disclosure also provide a mobile terminal including a display module that includes a flexible circuit board, a display screen electrically connected to the flexible circuit board, and a drive chip electrically connected to the flexible circuit board and the display screen. The drive chip is located on a first side of the display module that is opposite to a second side of the display module that constitutes a display side of the display screen.

According to an aspect of the disclosure, the mobile terminal also includes a communications device that is configured to access a communications network and communicate with other mobile terminals via the communications network.

It is to be understood that both the foregoing general description and the following detailed description are illustrative and explanatory only and are not restrictive of the present disclosure.

BRIEF DESCRIPTION OF THE DRAWINGS

The accompanying drawings, which are incorporated in and constitute a part of this specification, illustrate aspects consistent with the present disclosure and, together with the description, serve to explain the principles of the present disclosure.

Figure 1:
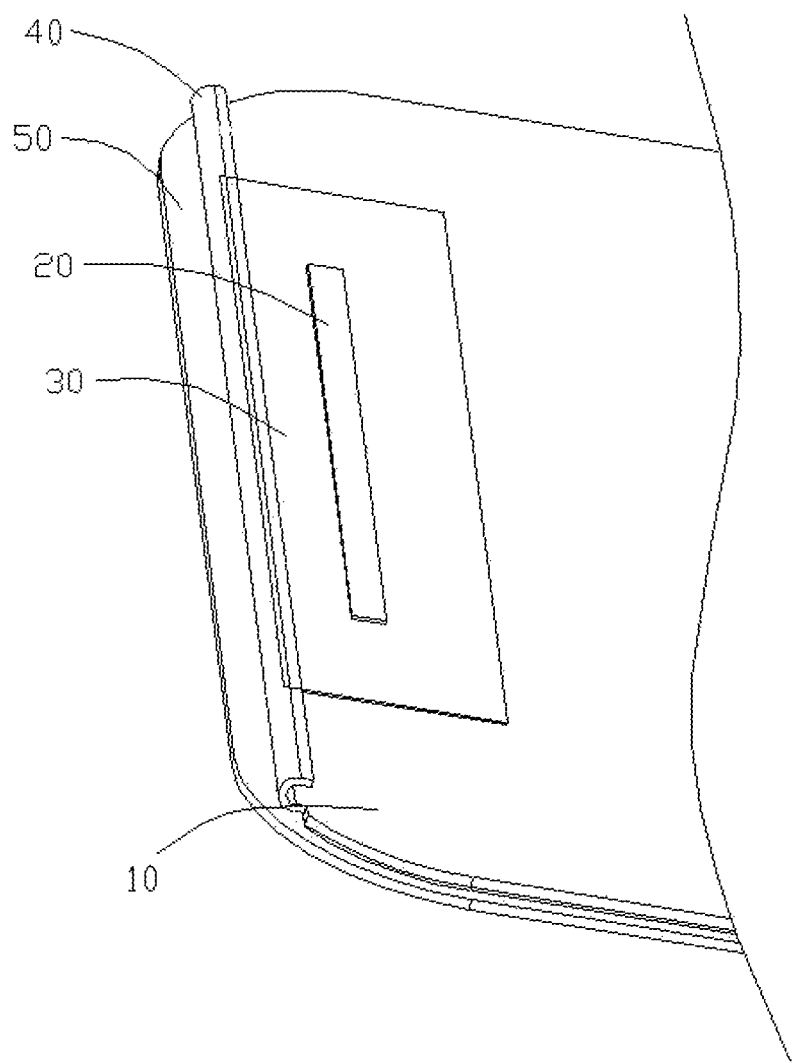
FIG. 1 is a structural diagram illustrating a part of a display module in accordance with an exemplary aspect of the present disclosure.
Figure 2:
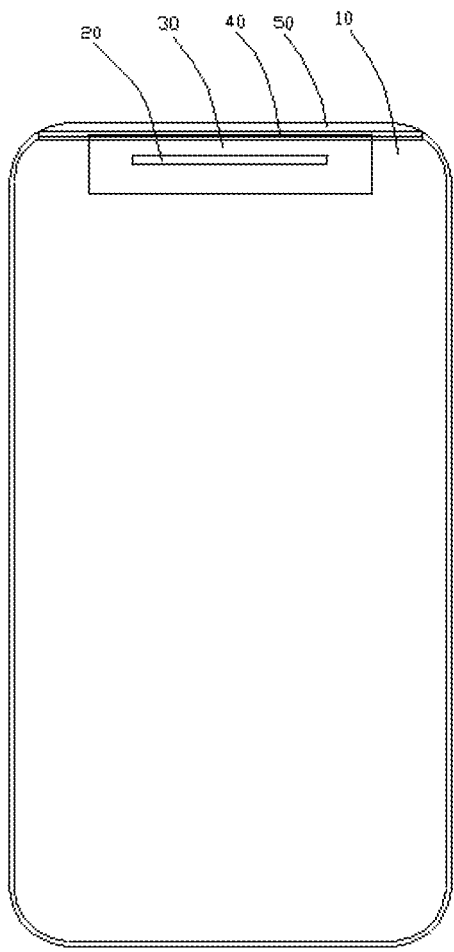
FIG. 2 is a front view of a display module in accordance with an exemplary aspect of the present disclosure.
Figure 3:
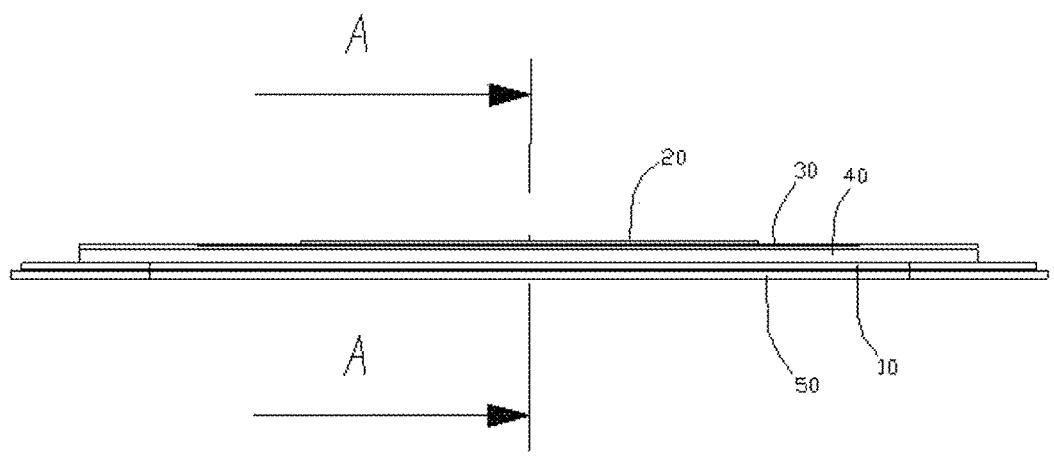
FIG. 3 is a bottom view of a display module in accordance with an exemplary aspect of the present disclosure.

The specific aspects of the present disclosure, which have been illustrated by the accompanying drawings described above, will be described in detail below. These accompanying drawings and description are not intended to limit the scope of the present disclosure in any manner, but to explain the concept of the present disclosure to those skilled in the art via referencing specific aspects

DETAILED DESCRIPTION

Reference will now be made in detail to exemplary aspects, examples of which are illustrated in the accompanying drawings. The following description refers to the accompanying drawings in which the same numbers in different drawings represent the same or similar elements unless otherwise represented. The implementations set forth in the following description of illustrative aspects do not represent all implementations consistent with the disclosure. Instead, they are merely examples of apparatuses and methods consistent with aspects related to the disclosure as recited in the appended claims.

In the present disclosure, the noun of locality such as "upper" and "lower" as used herein are generally described with an electronic device such as a mobile phone being in a state where it is placed horizontally, and in particular, "upper side" refers to a side at front side of the mobile phone, and "lower side" refers to a side at rear side of the mobile phone, unless otherwise stated.

As shown in FIGS. 1 to 4, there is provided a display module according to an aspect of the present disclosure. The display module includes: a flexible circuit board 30, a display screen 10 and a drive chip 20 both of which are electrically connected to the flexible circuit board 30. The drive chip 20 is electrically connected to the display screen 10 and is located on a side opposite to a display side of the display screen 10. In other words, the drive chip 20 is located below the display screen 10.

It is to be noted that the "electrically connection" as used herein includes two possible connection ways of direct electrical connection and indirect electrical connection. By taking that the display screen 10 is electrically connected to the driver chip 20 as an example, it includes the following two connection ways: (1) the display screen 10 is electrically and directly connected to the drive chip 20, that is, the display panel 10 and the drive chip 20 are electrically connected without other intermediate member between them; and (2) the display screen 10 is electrically and indirectly connected to the drive chip 20, that is, the drive chip 20 and the display screen 10 must be electrically connected by an intermediate conductive member.

In the present disclosure, by providing the drive chip 20 below the display screen 10, it is possible to prevent the drive chip 20 from occupying any space of a display area so as to enable the display screen 10 to occupy an area on a front side of the display module as much as possible. Thus, screen-to-body ratio of the device module can be increased and thereby user's experience can be improved.

In the present disclosure, the flexible circuit board is partially located in an area at the front side of the display module and the other part is located in an area at the rear side of the display module. In order to further increase the screen-to body ratio of the display module, the flexible circuit board may be entirely located in an area at the rear side of the display module. In the former case, for ease of electrical connection to the display screen, it is possible for the flexible circuit board to have an edge thereof curved upwardly so as to be electrically connected to the display screen 10, i.e., the flexible circuit board is formed in a flat plate structure having a curved edge. In the latter case, an electrical connection section 40 may be provided between the display screen 10 and the flexible circuit board 30 for facilitating electrical connection of the flexible circuit board to the display screen.

Figure 4:
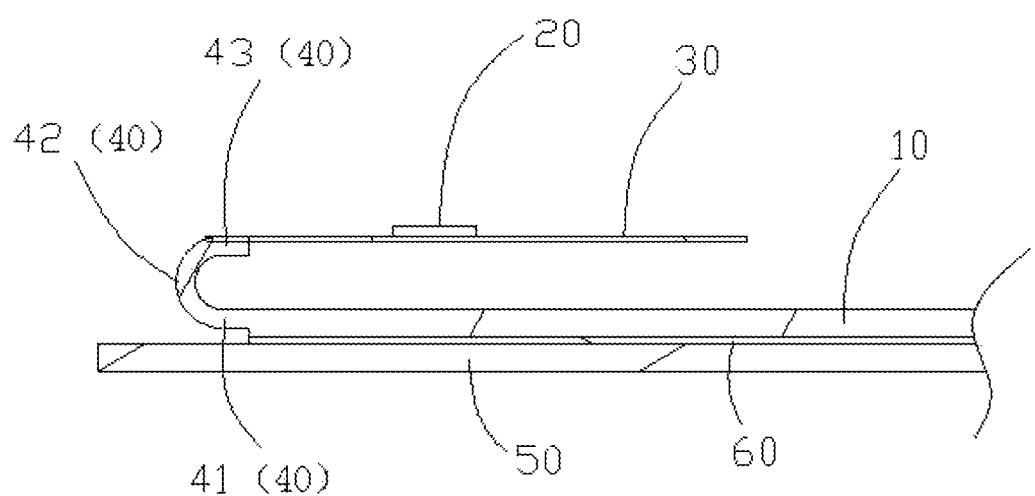
FIG. 4 is a diagram illustrating a part of a cross-section taken along the line A-A of FIG. 3 in accordance with an exemplary aspect of the present disclosure.

In one exemplary aspect, as shown in FIG. 4, the electrical connection segment 40 may include a first section 41, a curved section 42 and a second section 43 that is below the first section 41 by the curved section 42. The display screen 10 is electrically and directly connected to the first section 41, and the flexible circuit board 30 is electrically and directly connected to the second section 43. That is, the electrical connection section 40 is integrally formed as a U-shaped structure that opens toward a side of the display screen. Since the curved section 42 is more prone to stress concentration, the display screen 10 and the flexible circuit board 30 are connected to the curved section 42 through the first section 41 and the second section 43, respectively, so that the display module has a reliable durability, has an extended life circle.

In the present disclosure, the drive chip 20 is electrically and directly connected with the second section 43 of the electrical connection segment 40. Alternatively, in order to effectively utilize internal space of the display module and shorten length of the electrical connection segment 40, the drive chip 20 may be electrically and directly connected with the flexible circuit board 30, as shown in FIG. 1 and FIG. 4.

In the present disclosure, the electrical connection segment 40 may be any component that enables connection between circuits. For example, the electrical connection segment 40 may be a flexible circuit board. In one aspect, for ease of manufacture, the electrical connection segment 40 may be a flexible conductive film. The flexible conductive film may be, for example, a flexible conductive film of Graphene.

In the present disclosure, the flexible circuit board 30, the display screen 10, the first section 41 and the second section 43 are parallel to each other, and the curved section 42 is an arc structure such as a semicircular structure, as shown in FIG. 4, in order to make full use of internal space of the display module.

In the present disclosure, the flexible circuit board 30 has a rectangular structure, and the drive chip 20 has a long strip structure, and length direction of the flexible circuit board 30 is parallel to length direction of the drive chip 20 and parallel to width direction of the display screen 10, as shown in FIG. 1, in order for wiring within the display module. In this way, it is possible for the display module to have compact arrangement of wirings, and to effectively utilize internal space thereof.

In order to further increase the screen-to-body ratio of the display module, the electrical connection segment 40 may be integrally formed with the display screen 10.

In the present disclosure, the first section 41, the curved section 42 and second section 43 have the same thickness, and the thickness of the first section 41 is smaller than thickness of the display screen 10, as shown in FIG. 4, in order for easy manufacturing of the electrical connection segment 40. By setting the thickness of the electrical connection segment 40 to be less than the thickness of the display screen 10 in this way, it is possible for the electrical connection section 40 to be easily integrated with the display screen 10 and curved downward to form the curved section 42.

In the present disclosure, the display screen 10 may be any suitable display known to those skilled in the art. For example, the display screen 10 may be an LCD (Liquid Crystal Display) display screen, or an LED (Light Emitting Diode) display screen. In an exemplary aspect of the present disclosure, the display screen 10 may be an OLED (Organic Light-Emitting Diode) display screen in order for easy curving of the electrical connection segment 40 formed integrally with the display screen 10. Because an OLED has advantages of thinness, lightness, good flexibility and easy folding, it is possible for the display module not only to have thinner thickness, but also to meet the design requirement for a display module with a maximum screen-to body ratio.

In the present disclosure, a ratio of length of the display screen 10 to length of the first section 41 may be in a range from 90 to 115, in order to increase the screen-to-body ratio.

In the present disclosure, the display module further may farther include a cover glass 50 affixed to the display screen 10, and a ratio of length of the display screen 10 to length of the cover glass 50 may be in a range from 0.8 to 0.98, in order to increase the screen-to-body ratio.

In one exemplary aspect, the display screen 10 may be adhered to the cover glass 50 by photosynthetic glue.

According to another aspect of the present disclosure, there is provided a mobile terminal that includes a display module described above in detail.

In the present disclosure, the mobile terminal may be, for example, an electronic product such as a mobile phone or a computer.

It is noted that the various modules, sub-modules, units, and components in the present disclosure can be implemented using any suitable technology. For example, a module may be implemented using circuitry, such as an integrated circuit (IC). As another example, a module may be implemented as a processing circuit executing software instructions.

Other aspects of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as illustrative only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A display module comprising:
    a flexible circuit board;
    a display screen electrically connected to the flexible circuit board;
    a drive chip electrically connected to the flexible circuit board and the display screen, wherein the drive chip is located on a first side of the display module that is opposite to a second side of the display module that constitutes a display side of the display screen; and
    an electrical connection portion comprising a first section electrically and directly connected to the display screen, and a second section electrically connected to the first section via a curved section, wherein the second section is disposed under the first section and is electrically and directly connected to the flexible circuit board,
    wherein the electrical connection portion is integrally formed with the display screen, and
    wherein each one of the first section, the curved section, and the second section has a first thickness, and wherein the first thickness is less than a second thickness of the display screen.

2. The display module according to claim 1, wherein the drive chip is electrically and directly connected to the flexible circuit board.

3. The display module according to claim 2, wherein the flexible circuit board, the display screen, the first section, and the second section are parallel to one another, and wherein the curved section has an arc shape.

4. The display module according to claim 3, wherein the flexible circuit board has a rectangular shape, and the drive chip has a long strip shape, and wherein a length direction of the flexible circuit board is parallel to a length direction of the drive chip and parallel to a width direction of the display screen.

5. The display module according to claim 1, wherein the display screen is an organic light emitting diode (OLED) display screen.

6. The display module according to claim 1, wherein the electrical connection portion is a flexible conductive film.

7. The display module according to claim 1, wherein a ratio of a length of the display screen to a length of the first section is in a range from 90 to 115.

8. The display module according to claim 7, further comprising:
    a cover glass affixed to the display screen, wherein a ratio of a length of the display screen to a length of the cover glass is in a range from 0.8 to 0.98.

9. The display module according to claim 1, further comprising:
    a cover glass affixed to the display screen, wherein a ratio of a length of the display screen to a length of the cover glass is in a range from 0.8 to 0.98.

10. A mobile terminal comprising:
    a display module comprising:
        a flexible circuit board;
        a display screen electrically connected to the flexible circuit board;
        a drive chip electrically connected to the flexible circuit board and the display screen, wherein the drive chip is located on a first side of the display module that is opposite to a second side of the display module that constitutes a display side of the display screen; and
        an electrical connection portion comprising a first section electrically and directly connected to the display screen, and a second section electrically connected to the first section via a curved section, wherein the second section is disposed under the first section and is electrically and directly connected to the flexible circuit board,
        wherein the electrical connection portion is integrally formed with the display screen, and
        wherein each one of the first section, the curved section, and the second section has a first thickness, and wherein the first thickness is less than a second thickness of the display screen.

11. The mobile terminal according to claim 10, wherein the drive chip is electrically and directly connected to the flexible circuit board.

12. The mobile terminal according to claim 11, wherein the flexible circuit board, the display screen, the first section, and the second section are parallel to one another, and wherein the curved section has an arc shape.

13. The mobile terminal according to claim 10, wherein a ratio of a length of the display screen to a length of the first section is in a range from 90 to 115.

14. The mobile terminal according to claim 10, wherein the display module further comprises:
    a cover glass affixed to the display screen, wherein a ratio of a length of the display screen to a length of the cover glass is in a range from 0.8 to 0.98.

* * * * *